United States Patent
Xu et al.

(10) Patent No.: US 11,742,458 B2
(45) Date of Patent: *Aug. 29, 2023

(54) TEXTURED OPTOELECTRONIC DEVICES AND ASSOCIATED METHODS OF MANUFACTURE

(71) Applicant: Micron Technology, Inc., Boise, ID (US)

(72) Inventors: Lifang Xu, Boise, ID (US); Scott D. Schellhammer, Meridian, ID (US); Shan Ming Mou, Singapore (SG); Michael J. Bernhardt, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/855,593

(22) Filed: Jun. 30, 2022

(65) Prior Publication Data

US 2022/0336705 A1    Oct. 20, 2022

Related U.S. Application Data

(60) Continuation of application No. 16/922,940, filed on Jul. 7, 2020, now Pat. No. 11,411,139, which is a
(Continued)

(51) Int. Cl.
*H01L 33/22*    (2010.01)
*H01L 33/38*    (2010.01)
(Continued)

(52) U.S. Cl.
CPC .......... *H01L 33/38* (2013.01); *H01L 31/0236* (2013.01); *H01L 31/02168* (2013.01);
(Continued)

(58) Field of Classification Search
CPC ..... H01L 31/0236; H01L 33/02; H01L 33/10; H01L 33/20; H01L 33/22
See application file for complete search history.

(56) References Cited

U.S. PATENT DOCUMENTS

| 6,448,158 B2 | 9/2002 | Peng et al. |
| 9,337,366 B2 | 5/2016 | Xu et al. |

(Continued)

FOREIGN PATENT DOCUMENTS

| JP | 2008177625 A | 7/2008 |
| JP | 2010034230 A | 2/2010 |

OTHER PUBLICATIONS

Davood Raoufi et al. "Surface Characterization and Microstructure of ITO thin films at Different Annealing Temperatures" Applied Surface Science, 253 (2007), pp. 9085-9090.
(Continued)

*Primary Examiner* — Jae Lee
(74) *Attorney, Agent, or Firm* — Perkins Coie LLP

(57) ABSTRACT

Textured optoelectronic devices and associated methods of manufacture are disclosed herein. In several embodiments, a method of manufacturing a solid state optoelectronic device can include forming a conductive transparent texturing material on a substrate. The method can further include forming a transparent conductive material on the texturing material. Upon heating the device, the texturing material causes the conductive material to grow a plurality of protuberances. The protuberances can improve current spreading and light extraction from the device.

18 Claims, 7 Drawing Sheets

Related U.S. Application Data continuation of application No. 16/104,857, filed on Aug. 17, 2018, now Pat. No. 10,756,236, which is a division of application No. 15/149,740, filed on May 9, 2016, now Pat. No. 10,084,114, which is a division of application No. 13/190,872, filed on Jul. 26, 2011, now Pat. No. 9,337,366.

(51) Int. Cl.
H01L 31/0216 (2014.01)
H01L 31/0236 (2006.01)
H01L 33/42 (2010.01)
H01L 33/58 (2010.01)

(52) U.S. Cl.
CPC .............. *H01L 33/22* (2013.01); *H01L 33/42* (2013.01); *H01L 33/58* (2013.01); *H01L 2933/0091* (2013.01); *Y02E 10/50* (2013.01)

(56) References Cited

U.S. PATENT DOCUMENTS

| | | |
|---|---|---|
| 10,084,114 B2 | 9/2018 | Xu et al. |
| 10,756,236 B2 | 8/2020 | Xu et al. |
| 2005/0110007 A1 | 5/2005 | Forrest et al. |
| 2008/0006842 A1* | 1/2008 | Seong .................... H01L 33/22 |
| | | 257/E33.074 |
| 2008/0061030 A1 | 3/2008 | Liu et al. |
| 2008/0315229 A1 | 12/2008 | Yi et al. |
| 2009/0026471 A1 | 1/2009 | Wu et al. |
| 2010/0035179 A1 | 2/2010 | Kim et al. |
| 2010/0051981 A1 | 3/2010 | Osawa et al. |
| 2010/0059768 A1 | 3/2010 | Hasnain |
| 2010/0075176 A1 | 3/2010 | Yamada et al. |
| 2010/0117070 A1 | 5/2010 | Taraschi et al. |
| 2010/0129536 A1* | 5/2010 | Yamada .............. C03C 17/2456 |
| | | 204/192.15 |
| 2011/0198567 A1 | 8/2011 | Shinohara et al. |
| 2012/0292629 A1 | 11/2012 | Wu et al. |
| 2013/0026481 A1 | 1/2013 | Xu et al. |
| 2016/0254412 A1 | 9/2016 | Xu et al. |
| 2018/0374993 A1 | 12/2018 | Xu et al. |
| 2020/0335665 A1 | 10/2020 | Xu et al. |

OTHER PUBLICATIONS

"International Search Report and Written Opinion dated Jan. 29, 2013 in International Application No. PCT/US2012/045596, 8 pages."

"Office Action dated Jun. 11, 2015 in Taiwan Application No. 101126375, 7 pages."

* cited by examiner

TEXTURED OPTOELECTRONIC DEVICES AND ASSOCIATED METHODS OF MANUFACTURE

CROSS-REFERENCE TO RELATED APPLICATION

This application is a continuation of U.S. application Ser. No. 16/922,940, filed Jul. 7, 2020; which is a continuation of U.S. application Ser. No. 16/104,857, filed Aug. 17, 2018, now U.S. Pat. No. 10,756,236; which is a division of U.S. application Ser. No. 15/149,740, filed May 9, 2016, now U.S. Pat. No. 10,084,114; which is a divisional of U.S. application Ser. No. 13/190,872, filed Jul. 26, 2011, now U.S. Pat. No. 9,337,366; which is incorporated herein by reference in its entirety.

TECHNICAL FIELD

The present disclosure is related to textured optoelectronic devices and associated methods of manufacturing textured optoelectronic devices.

BACKGROUND

Optoelectronic devices source, detect and/or control radiation, including gamma rays, X-rays, ultraviolet and infrared radiation and visible light. Examples of optoelectronic devices include electrical-to-optical or optical-to-electrical transducers, such as light emitting diodes ("LEDs"), organic light emitting diodes ("OLEDs"), polymer light emitting diodes ("PLEDs"), and solar (photovoltaic) cells. Optoelectronic devices often include an electrode made from a transparent conductive oxide through which the radiation can pass. However, conductive oxide electrodes can reflect a portion of the radiation back into the device. This "lost" radiation can decrease light extraction efficiency, waste energy, and reduce output. Accordingly, several improvements in light emission/absorption efficiency of optoelectronic devices may be desirable.

DETAILED DESCRIPTION

Various embodiments of optoelectronic devices and associated methods of using and manufacturing optoelectronic devices are described below. As used hereinafter, the term "optoelectronic device" generally refers to devices with semiconductor LEDs, PLEDs, OLEDs, laser diodes, solar cells/photovoltaic cells, or other types of solid state devices that convert between electrical energy and electromagnetic radiation in a desired spectrum. The terms "light emitting die" or "solid state emitter" ("SSE") includes LEDs, PLEDs, OLEDs, and other similar devices. Additionally, the term substrate refers to supports for individual optoelectronic devices and larger wafers or workpieces upon which a plurality of optoelectronic devices are formed or mounted. A person skilled in the relevant art will also understand that the technology may have additional embodiments and that the technology may be practiced without several of the details of the embodiments described below with reference to FIGS. 1-5B.

Figure 1:
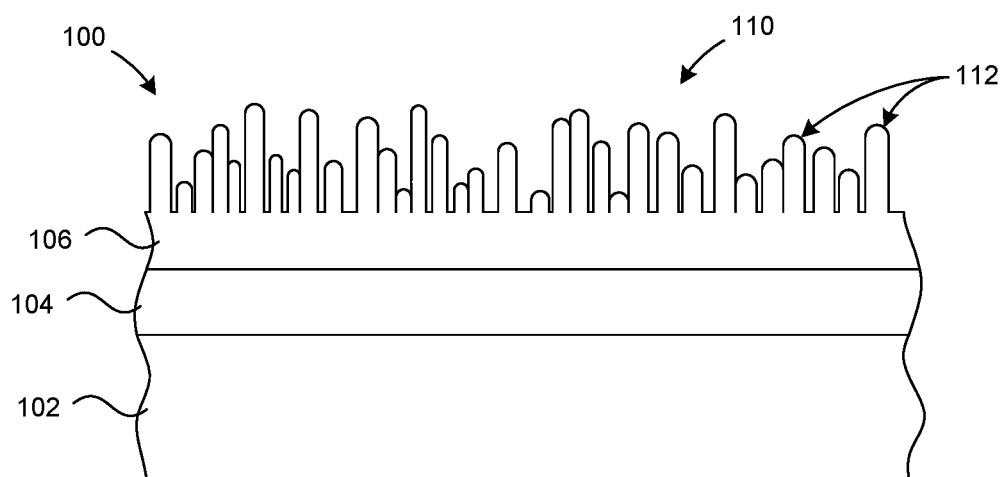
FIG. 1 is a schematic cross-sectional view of an optoelectronic device in accordance with an embodiment of the technology.

FIG. 1 is a schematic cross-sectional view of an optoelectronic device 100 in accordance with an embodiment of the technology. The optoelectronic device 100 includes an optoelectronic transducer 102, a conductive transparent texturing material 104 on the optoelectronic transducer 102, and a transparent conductive material 106 on the transparent texturing material 104. In some embodiments, the transparent texturing material 104 is titanium and the transparent conductive material 106 is Indium Tin Oxide (ITO). The transparent conductive material 106 includes a textured surface 110 having a plurality of protuberances 112 projecting away from the optoelectronic transducer 102. The protuberances 112 can comprise a plurality of irregular pillars, spikes, and/or bumps, among others, in a random or undefined pattern across the optoelectronic transducer 102.

In operation, radiation emitted from the optoelectronic transducer 102 passes through the transparent texturing material 104 and the conductive material 106. Several embodiments of the optoelectronic device 100 with the textured surface 110 are expected to increase light extraction and the uniformity of current through the transducer 102. For example, the textured surface 110 can reduce the loss of radiation to internal reflection, thereby increasing light extraction. In one simulation, light extraction efficiency for an optoelectronic device having an un-textured (generally planar) conductive material was approximately 50%. Comparatively, for a device 100 having texturing/protuberances 112 on the conductive material 106, light extraction efficiency was approximately 96%. These advantages are provided without losing functional area of the optoelectronic device 102.

The present technology further includes methods of manufacturing optoelectronic devices having a conductive portion. For example, one method of forming a conductive portion on a substrate includes forming a titanium material on the substrate, forming a conductive material on the titanium, and heating the conductive material. The conductive material initially has a first surface roughness before it is heated and a second surface roughness significantly greater than the first surface roughness after heating. One embodiment of this method is described in further detail below with reference to FIGS. 2A-2C. Additionally, variations on these methods and the resulting devices are described below with reference to FIGS. 3A-5B.

Figure 2A:
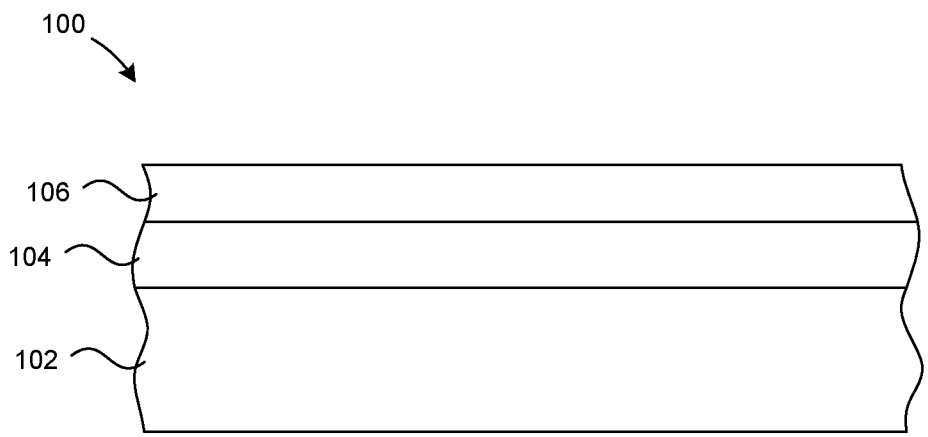
FIGS. 2A-2C are schematic cross-sectional views of an optoelectronic device undergoing a process of forming a textured surface in accordance with an embodiment of the technology.
Figure 2B:
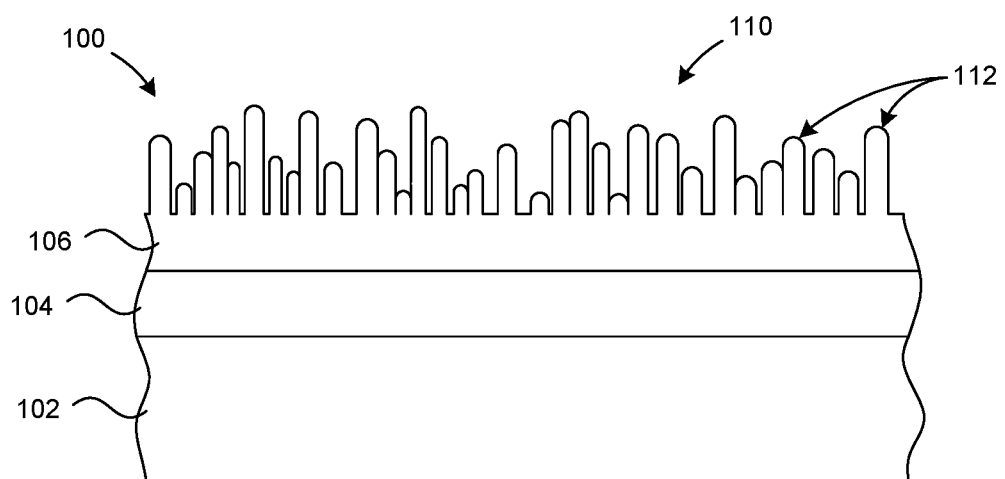
Figure 2C:
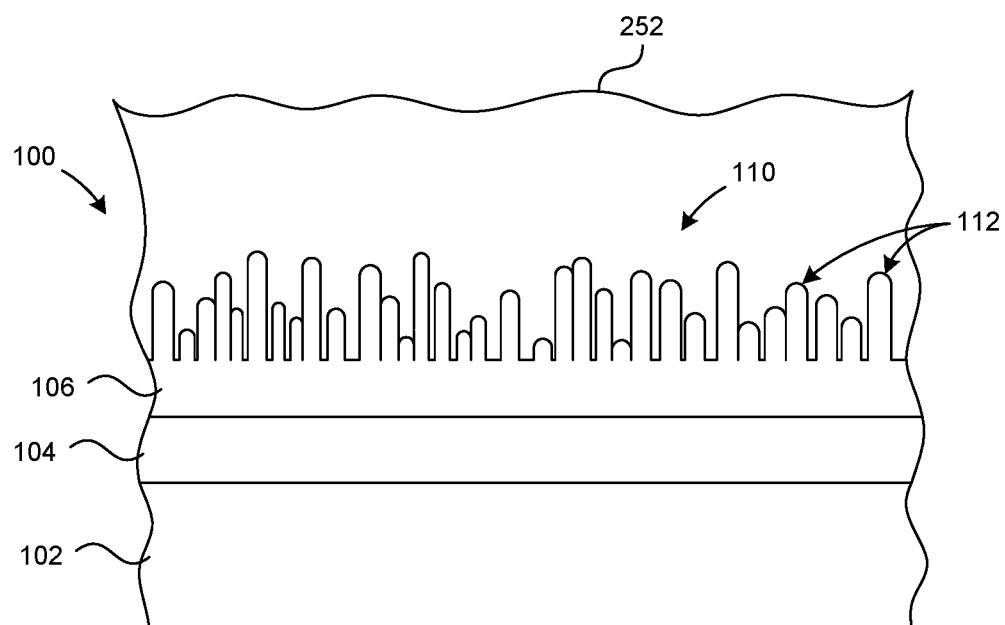

FIGS. 2A-2C are schematic cross-sectional views of an optoelectronic device 100 undergoing a process of forming the transparent conductive material 106 with the textured surface 110 in accordance with an embodiment of the technology. FIG. 2A shows the optoelectronic device 100 after the translucent texturing material 104 has been formed, or deposited, on an optoelectronic transducer 102 and the transparent conductive material 106 has been formed, or grown, on the texturing material 104. As discussed above with reference to FIG. 1, in some embodiments the texturing material 104 is titanium and the conductive material 106 is ITO. In a particular embodiment, the conductive material 106 is approximately 43.6% Indium, 2.9% Tin and 53.5% Oxide. In other embodiments, the texturing material 104 and conductive material 106 are other materials through which radiation can pass. In one embodiment, the texturing material 104 has a thickness ranging from about 20 angstroms to about 400 angstroms, and in a particular embodiment the texturing material 104 has a thickness ranging from about 30 angstroms to about 60 angstroms. In some embodiments, the conductive material 106 has a thickness ranging from about 20 angstroms to about 4000 angstroms.

FIG. 2B illustrates the optoelectronic device 100 after the textured surface 110 has been formed on or otherwise imported to the conductive material 106. The textured surface 110 can be formed by heating the device 100, a portion of the device 100, or an environment in which the device is positioned, to a temperature from about 100° C. to about 600° C. In a particular embodiment, the device 100 is heated to a temperature from about 350° C. to about 450° C. The inventors have discovered that heating the conductive material 106 to such temperatures or in an environment of such temperatures with the texturing material 104 causes the textured surface 110 to form (e.g., grow). In some embodiments, the textured surface 110 takes the form of irregular, pillar-like protuberances 112 projecting away from the optoelectronic transducer 102. The density and magnitude of the texturing (e.g., the size, shape, arrangement, and/or number of protuberances 112) can be sensitive to the heating temperature. After heating, the textured surface 110 of the conductive material 106 can have a texture or roughness that is significantly greater than the roughness of the underlying texturing material 104. Although only a single optoelectronic device 100 is shown in FIGS. 2A and 2B, the methods described herein can be performed simultaneously or approximately simultaneously on multiple devices across a workpiece.

FIG. 2C illustrates the device 100 after a portion of a lens 252 has been formed over the optoelectronic transducer 102. The lens 252 can include a transmissive material made from silicone, polymethylmethacrylate, resin, or other materials with suitable properties for transmitting the radiation emitted by the optoelectronic transducer 102. The lens 252 can be positioned over the optoelectronic transducer 102 such that light emitted by the optoelectronic transducer 102 passes through the lens 252. The lens 252 can include various diffusion features, such as a curved shape, to diffract or otherwise change the direction of light emitted by the optoelectronic transducer 102 as it exits the lens 252.

In selected embodiments, a converter material along and/or in the lens 252 generates a desired color of light from the optoelectronic transducer. The converter material can include a phosphor-containing cerium (III)-doped yttrium aluminum garnet (YAG) at a particular concentration for emitting a range of colors from green to yellow to red under photoluminescence. In other embodiments, the converter material can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium (IV)-doped YAG, dysprosium-doped YAG, samarium-doped YAG, terbium-doped YAG, and/or other suitable wavelength conversion materials. In other embodiments, the converter material can be a remote phosphor separate from the lens 252, a direct phosphor in direct contact with the optoelectronic transducer, or it can be absent altogether.

Figure 3A:
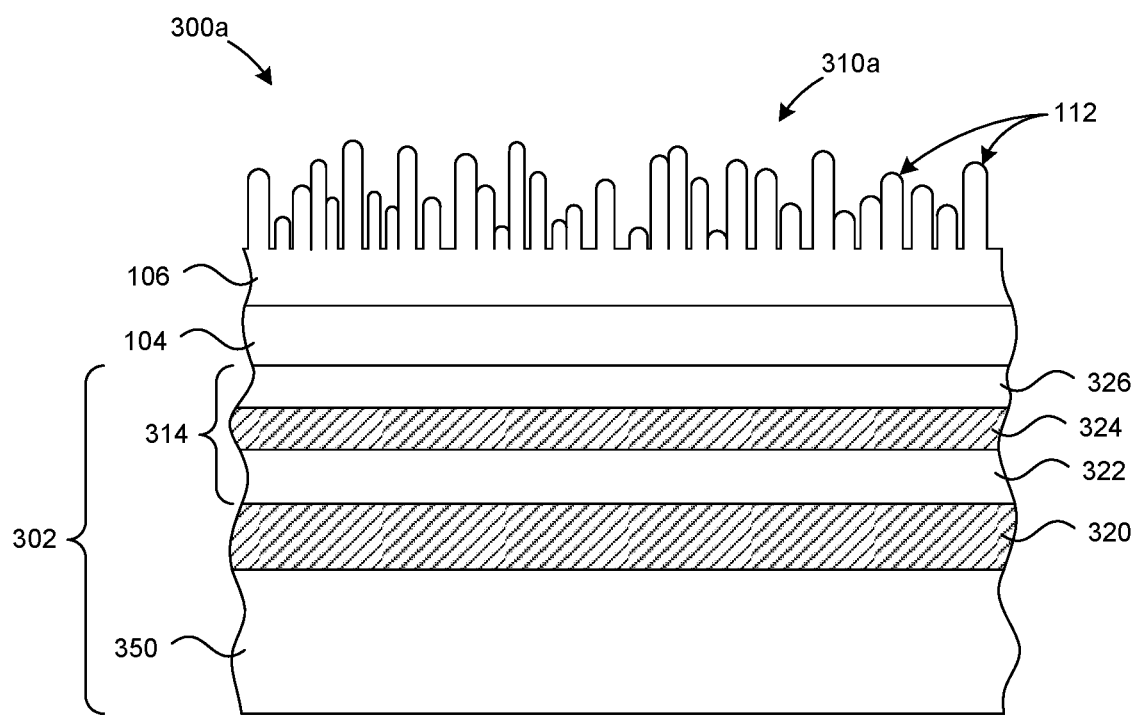
FIGS. 3A and 3B are schematic cross-sectional views of optoelectronic devices having solid state emitters (SSEs) in accordance with embodiments of the technology.
Figure 3B:
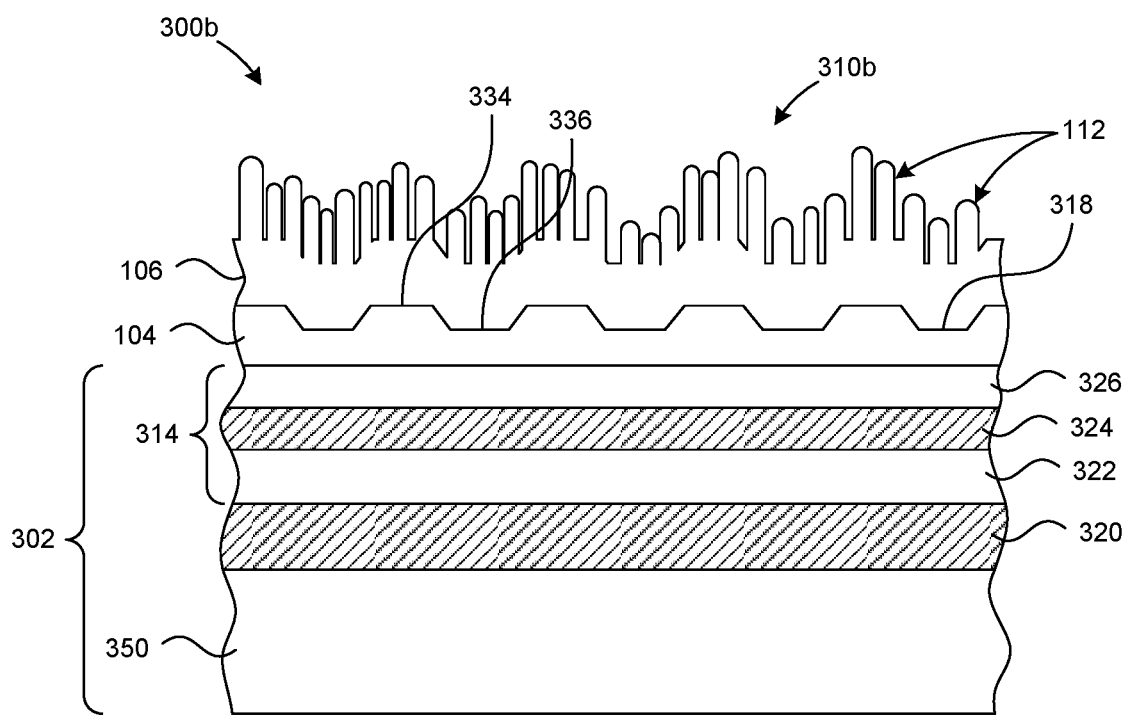

FIGS. 3A and 3B are schematic cross-sectional views of optoelectronic devices 300a, 300b having solid state emitters (SSEs) 314 in accordance with additional embodiments of the technology. FIG. 3A shows an optoelectronic device 300a formed using methods generally similar to those described above with reference to FIGS. 2A-2C. For example, a texturing material 104 is formed on an optoelectronic transducer 302, and a conductive material 106 is formed on the texturing material 104. As described above, the texturing and conductive materials 104, 106 can be transparent materials. The conductive material 106 can be heated to form a textured surface 310a having pillars or other types of protuberances 112 as described above with reference to FIG. 2B.

The SSE 314 can include a first semiconductor material 322, a second semiconductor material 326 and an active region 324 between the first and second semiconductor materials 322, 326. In one embodiment, the first semiconductor material 322 is a P-type gallium nitride (GaN) material, the active region 324 is an indium gallium nitride (InGaN) material, and the second semiconductor material 326 is a N-type GaN material. The first semiconductor material 322, active region 324, and second semiconductor material 326 can be deposited or otherwise grown or formed using chemical vapor deposition ("CVD"), physical vapor deposition ("PVD"), atomic layer deposition ("ALD"), plating, or other techniques known in the semiconductor fabrication arts. The SSE 314 can further include a reflective material 320 formed between the substrate 350 and the SSE 314.

In operation, as current flows from the first semiconductor material 322 to the second semiconductor material 326, charge carriers flow from the second semiconductor material 326 toward the first semiconductor material 322 and cause the active region 324 to emit radiation. The radiation propagates directly through the conductive material 106 or reflects off the reflective material 320 and passes back through the first semiconductor material 322, active region 324, and second semiconductor material 326. The radiation passes through the transparent texturing material 104 and is transmitted through and refracted by the protuberances 112. In other embodiments, the SSE 314 can take other forms or arrangements that are known in the art.

FIG. 3B is a schematic cross-sectional view of an optoelectronic device 300b formed in a generally similar manner as the device 300a shown in FIG. 3A, but varies from the device 300a in that the texturing material 104 has a non-planar outer surface 318. In the illustrated embodiment, the outer surface 318 includes ridges 334 and valleys 336. In other embodiments, the first semiconductor material 322, the active region 324, the second semiconductor material 326, the reflective material 320 and/or the optoelectronic transducer 302 may additionally or alternately be uneven or patterned. A conductive material 106 is formed on the outer surface 318 of the texturing material 104 and can have a macro-profile corresponding to the pattern on the outer surface 318. The contour of the texturing material 104 and the conductive material 106 can affect the growth pattern of protuberances 112 on a textured surface 310b of the conductive material 106. In the illustrated embodiment, for example, the protuberances 112 positioned over the ridges 334 generally extend further from the optoelectronic device 302 than do the protuberances 112 positioned over the valleys 336. The ridge 334 and valley 336 pattern shown in FIG. 2B is merely representative of one particular pattern for the texturing material 104. A wide variety of different patterns or arrangements can be applied to the texturing material 104. In some embodiments, for example, the outer surface 318 can have a random texture, while in other embodiments the outer surface 318 can have a pre-planned pattern of ridges 334 and valleys 336 that corresponds to a desired pattern of the resulting protuberances 112.

Figure 4A:
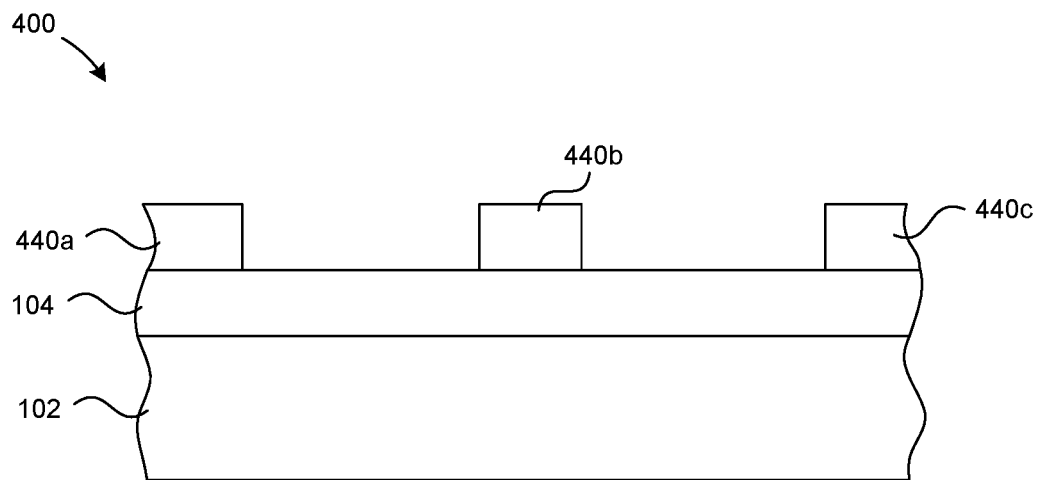
FIGS. 4A and 4B are schematic cross-sectional views of an optoelectronic device undergoing a process of forming a textured surface using a mask in accordance with an embodiment of the technology.
Figure 4B:
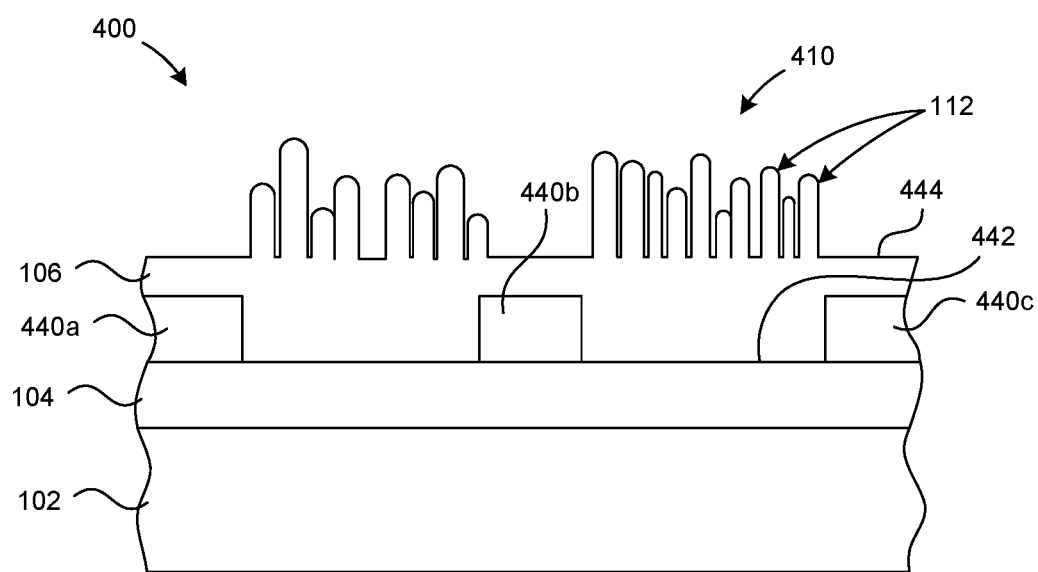

FIGS. 4A and 4B are schematic cross-sectional views of an optoelectronic device 400 undergoing a process of forming a textured surface 410 using a mask 440 (identified individually as mask elements 440a-440c) in accordance with an embodiment of the technology. FIG. 4A shows a transparent texturing material 104 that has been formed on an optoelectronic transducer 102. The mask 440 is deposited and patterned to form the mask elements 440a-440c that define barriers over the texturing material 104. In some embodiments, the mask 440 is made of titanium nitride, but other materials may be used in other embodiments.

FIG. 4B shows the optoelectronic device 400 after a conductive material 106 has been formed over the exposed portions of the texturing material 104 and the mask 440. The conductive material 106 can be heated to grow a textured surface 410 having pillars or protuberances 112 as described above with reference to FIG. 2B. The protuberances 112 grow over the exposed portions 442 of the texturing material 104, but not over the mask 440. The planar portions 444 of the conductive material 106 that overlie the mask 440 remain generally un-textured. The mask 440, therefore, can be patterned on the texturing material 104 to selectively expose portions 442 of the texturing material 104 where protuberances 112 are desired.

Although the illustrated embodiment shows three mask elements 440a-440c, in other embodiments the mask 440 can have a different arrangement and/or any number of mask elements on the surface of the texturing material 104. The mask 440 can be configured depending on the intended purpose of the planar portion 444. For example, in some embodiments, the mask 440 can be configured so that the planar portion 444 remains generally flat for attaching bond pads (not shown) to the device 400. In another embodiment, the planar portion 444 can be used as a contact point for securing alignment of the device 400 on a substrate or electronic device (not shown). In this example, the mask 440 can be approximately the same size and have the same arrangement as the securing device contacts. In still another embodiment, the mask can be used to determine the selectivity of light absorption in a solar panel or cell.

Figure 5A:
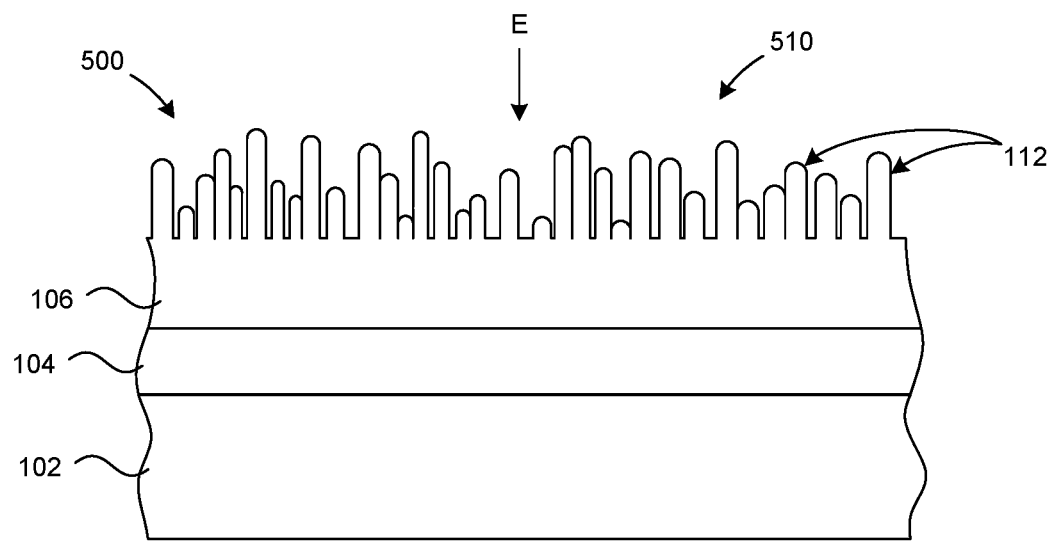
FIGS. 5A and 5B are schematic cross-sectional views of an optoelectronic device undergoing a pattern-transfer process in accordance with an embodiment of the technology.
Figure 5B:

FIGS. 5A and 5B are schematic cross-sectional views of an optoelectronic device 500 undergoing a pattern-transfer process in accordance with an embodiment of the technology. Referring to FIGS. 5A and 5B together, the optoelectronic device 500 has been formed using methods generally similar to those described above with reference to FIGS. 2A-2C. For example, a texturing material 104 is formed on an optoelectronic transducer 102, and a conductive material 106 is formed on the texturing material 104. As described above, the texturing and conductive materials 104, 106 can be transparent materials. The conductive material 106 is heated to grow a textured surface 510 having pillars or protuberances 112 described above with reference to FIG. 2B.

The protuberances 112 can be used as a mask to transfer the textured pattern 510 to an underlying layer (e.g., the optoelectronic transducer 102) of the device 500 by etching in the direction of arrow E. Specifically, various etching techniques, such as dry etching, can be used to remove all or a portion of the conductive material 106, the texturing material 104 and/or the optoelectronic transducer 102. By etching away a portion of the optoelectronic device 500, the irregular and/or random texture of the textured pattern can be transferred to the optoelectronic transducer 102 without resorting to time- and chemical-intensive alternate techniques, such as photolithography or wet etching.

From the foregoing, it will be appreciated that specific embodiments of the technology have been described herein for purposes of illustration, but that various modifications may be made without deviating from the disclosure. For example, some of the embodiments described above show the optoelectronic device as a SSE. However, other embodiments can include alternate devices described above, such as solar cells. Furthermore, some of the embodiments described above discuss using titanium and indium tin oxide for the conductive and texturing materials, respectively. However, in other embodiments, other materials or compounds having similar characteristics, properties or functions can be used. Many of the elements of one embodiment may be combined with other embodiments in addition to or in lieu of the elements of the other embodiments. Accordingly, the disclosure is not limited except as by the appended claims.

We claim:

1. An optoelectronic device, comprising:
a base layer configured for optoelectronic functions;
a Titanium-based texturing material; and
a top layer, wherein the texturing material is disposed between the base layer and the top layer, wherein:
the top layer includes a surface having a plurality of protuberances,
the plurality of protuberances has a pattern representative of irregular pillars, and
the top layer directly contacts the texturing material and is configured to react with the texturing material to grow the irregular pillars.

2. The optoelectronic device of claim 1 wherein the top layer includes one or more materials that react with the texturing material under heat to grow the irregular pillars.

3. The optoelectronic device of claim 1 wherein the plurality of protuberances extend away from the base layer to increase light extraction efficiency of the optoelectronic device.

4. The optoelectronic device of claim 1 wherein the pattern is a random pattern.

5. The optoelectronic device of claim 4 wherein the random pattern is dry-etched into the top layer.

6. The optoelectronic device of claim 1 wherein the plurality of protuberances form a pattern, wherein the pattern includes a first portion of the surface and a second portion of the surface, wherein the first portion of the surface includes at least a portion of the plurality of protuberances, and wherein the second portion of the surface is devoid of the plurality of protuberances.

7. The optoelectronic device of claim 1 wherein the plurality of protuberances form a pattern, wherein the pattern includes a first portion of the surface having a first portion of the plurality of protuberances and a second portion of the surface having a second portion of the plurality of protuberances, wherein the first portion of the plurality of protuberances, on average, extend outwardly further than the second portion of the plurality of protuberances.

8. The optoelectronic device of claim 1 wherein the plurality of protuberances are located according to a random pattern laterally across the top layer.

9. The optoelectronic device of claim 1 wherein the pattern of the plurality of protuberances include pillars having irregular sizes and/or shapes.

10. The optoelectronic device of claim 1 wherein the pattern of the plurality of protuberances corresponds to a number, a shape, an arrangement and/or a size associated with growing pillars using the one or more types of materials.

11. The optoelectronic device of claim 1 wherein the pattern of the plurality of protuberances includes characteristic of etching away the irregular pillars.

12. The optoelectronic device of claim 11 wherein the etching characteristics of the pattern of the plurality of protuberances does not correspond to photolithography or wet etching.

13. The optoelectronic device of claim 1 wherein the base layer includes an optoelectronic transducer.

14. The optoelectronic device of claim 1 wherein the base layer includes an emitter.

15. The optoelectronic device of claim 14 wherein the emitter is a solid state emitter.

16. The optoelectronic device of claim 14 wherein the emitter includes:
 a first semiconductor material;
 an active region; and
 a second semiconductor material, wherein-
  the active region is positioned between the first semiconductor material and the second semiconductor material, and
  the second semiconductor material contacts the texturing material.

17. The optoelectronic device of claim 1 wherein the top layer includes one or more metallic material and an oxide.

18. The optoelectronic device of claim 17 wherein the top layer includes Indium Tin Oxide (ITO).

* * * * *